United States Patent [19]

Taira

[11] Patent Number: 5,737,261
[45] Date of Patent: Apr. 7, 1998

[54] NON-VOLATILE FERROELECTRIC MEMORY UTILIZING RESIDUAL POLARIZATION OF A FERROELECTRIC FILM

[75] Inventor: Shigenobu Taira, Kawasaki, Japan

[73] Assignee: Fujitsu Limited, Kawasaki, Japan

[21] Appl. No.: 768,566

[22] Filed: Dec. 18, 1996

[30] Foreign Application Priority Data

Jun. 18, 1996 [JP] Japan ..................... 8-157088

[51] Int. Cl.⁶ ..................... G11C 11/22
[52] U.S. Cl. ..................... 365/145; 365/149; 257/295
[58] Field of Search ..................... 365/145, 149; 257/295

[56] References Cited

U.S. PATENT DOCUMENTS 5,446,688  8/1995  Torimaru ..................... 365/145
5,495,438  2/1996  Omura .

FOREIGN PATENT DOCUMENTS

| 2-185789 | 1/1989 | Japan . |
| 2-90571 | 3/1990 | Japan . |
| 2-158173 | 6/1990 | Japan . |
| 5-152578 | 6/1993 | Japan . |
| 5-205487 | 8/1993 | Japan . |
| 6-76562 | 3/1994 | Japan . |
| 6-196647 | 7/1994 | Japan . |
| 7-335771 | 12/1995 | Japan . |

*Primary Examiner*—Vu A. Le
*Attorney, Agent, or Firm*—Armstrong, Westerman, Hattori, McLeland & Naughton

[57] ABSTRACT

A ferroelectric memory using residual polarization of a ferroelectric film. The memory includes a semiconductor substrate of one conductive type; a write transistor having a source region and a drain region of another conductive type formed at a surface of the semiconductor substrate; a read transistor having a source region and a drain region of another conductive type formed at the surface of the semiconductor substrate; and a storage transistor having a source region and a drain region of one conductive type at the surface of the semiconductor substrate. One source or drain region of the write transistor is connected to a gate electrode of the storage transistor, and one source or drain region of the storage transistor is connected to one source or drain region of the read transistor so as to provide a memory cell. A write or erase operation is performed by inducing polarization in the ferroelectric film through applying a predetermined voltage between the well region and the gate electrode of the storage transistor, and a read operation is performed by detecting a drain current for the storage transistor through the read transistor generated in accordance with the residual polarization.

9 Claims, 11 Drawing Sheets

|  | Write | Read | Erase |
|---|---|---|---|
| EL1 | H=Vcc-Vth | H=Vcc-Vth | 0v |
| EL2 | H=Vcc-Vth | H=Vcc-Vth | 0v |
| WW1 | Vcc Selected | Vcc | Vcc |
| WW2 | 0v Non-selected | Vcc | Vcc |
| WB1 | VG1~VG4 | Vcc | Vcc |
| WB2 | Vcc | Vcc | Vcc |
| RW1 | 0v | Vcc | 0v |
| RW2 | 0v | 0v Non-selected | 0v |
| RB1 | — | (Id detection) | — |
| RB2 | — | — | — |

FIG. 12

NON-VOLATILE FERROELECTRIC MEMORY UTILIZING RESIDUAL POLARIZATION OF A FERROELECTRIC FILM

BACKGROUND OF THE INVENTION

1. Field of the Invention

The present invention relates to a nonvolatile semiconductor memory employing an MFS (Metal-Ferroelectrics-Semiconductor) transistor, which utilizes residual polarization of a ferroelectric material, to store multi-bit data.

2. Description of the Related Art

A nonvolatile semiconductor memory, which employs an MFS (Metal-Ferroelectrics-Semiconductor) transistor utilizing residual polarization of a ferroelectric material, has been proposed as a memory with which high integration is possible with a simple memory cell structure, and in which stored data can be retained even when no power source is provided. With such a memory, which is basically nonvolatile, a specific voltage or higher is applied to a ferroelectric film and polarization occurs, and even when application of the voltage is halted, the polarized condition is maintained and data is stored. In addition, since this memory has a shorter period required for data writing and erasing, unlike a currently popular EEPROM, it is anticipated that it will serve as large capacity, nonvolatile memory, which will be used as a replacement for the current DRAM.

As a memory that employs a ferroelectric film, for example, a three-transistor type memory that includes an MFS transistor and write and read transistors is disclosed in Japanese Unexamined Patent Publication No. Hei 6-196647. A memory of this type stores, as data 1s or 0s, conditions where a channel is formed between the source and the drain of an MFS transistor or where a channel is not formed between them depending on the residual polarization being retained or not in the ferroelectric film of the MFS transistor. Also proposed are the storage of residual polarization, for which a magnitude is consonant with a voltage applied to the ferroelectric film of the MFS transistor, in the three-transistor type memory, and the use of three-transistor type memory to serve as a multi-bits data memory by detecting the magnitude of a drain current of the MFS transistor that is consonant with the residual polarization.

Figure 11:
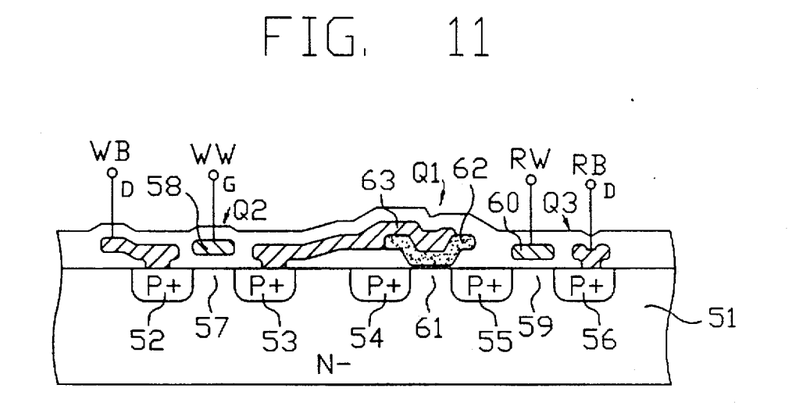
FIG. 11 is a cross sectional view of a conventional ferroelectric memory.
Figure 12:
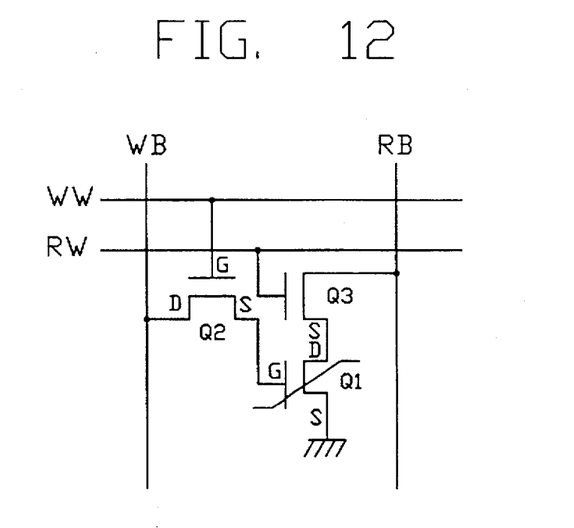
FIG. 12 is a circuit diagram illustrating a conventional ferroelectric memory.

FIG. 11 is a cross-sectional view of a ferroelectric memory of the three-transistor type disclosed in Japanese Unexamined Patent Publication No. Hei 6-196647, and FIG. 12 is a diagram of the memory cell circuit. In this memory, a write transistor Q2 is rendered conductive, and a high potential from the write bit line WB, and a low potential applied to an N substrate 51 are applied to a ferroelectric film 62 for polarization. A drain electrode of an MFS transistor Q1, which is changed in consonance with the magnitude of residual polarization, is read and detected via a read bit line RB from a read transistor Q3. In FIG. 11, Reference numerals 52, 53, 54, 55 and 56 denote source and drain regions of individual transistors; 57, 61 and 59, channel regions lying in between; and 58, 63 and 60, gate electrodes. Reference symbol WW in FIG. 12 denotes a write word line and RW denotes a read word line.

In the above memory cell structure, a voltage consonant with multi-bits data is applied to the ferroelectric film 62 of the MFS transistor Q1, and the corresponding magnitude of polarization is retained and is detected by using the magnitude of a drain current of the MFS transistor Q1. For data writing, a negative voltage is, for example, applied to the N semiconductor substrate 51, a voltage of 0 V is applied to the write bit line WB, and a voltage in the direction from the substrate 51 to the gate electrode 63 is applied to the ferroelectric film 62.

As a result, the PN junction between a drain 52 of the P channel transistor Q2, which is connected to the write bit line WB, and the substrate 51 is placed in a forward bias condition, so that a current flows from the drain region 52 to the substrate 51. As a result, a target operation can not be performed. Furthermore, the potential at the substrate 51 must be changed greatly for writing and reading operations. When the potential is changed at the substrate 51 that is used in common with another memory cell, driving of the memory becomes complicated, and a large current is required to drive the substrate 51.

SUMMARY OF THE INVENTION

To resolve the above shortcomings, it is one object of the present invention to provide a ferroelectric memory that can be easily driven.

It is another object of the present invention to provide a ferroelectric memory to resolve a problem wherein an operation is disabled because a PN junction is placed in a forward bias condition at the time of data writing.

To achieve the above object, according to the present invention, a memory using residual polarization of a ferroelectric film comprises:

a semiconductor substrate of one conductive type, a write transistor having a source region and a drain region of another conductive type formed at a surface of the semiconductor substrate, a read transistor having a source region and a drain region of another conductive type formed at the surface of the semiconductor substrate, and a storage transistor having a source region and a drain region of one conductive type formed at a well region of another conductive type at the surface of the semiconductor substrate, wherein one source or drain region of the write transistor is connected to a gate electrode of the storage transistor, one source or drain region of the storage transistor is connected to one source or drain region of the read transistor so as to provide a memory cell, write or erase operation is performed by inducing polarization in the ferroelectric film through applying a predetermined voltage between the well region and the gate electrode of the storage transistor, and read operation is performed by detecting a drain current of the storage transistor through the read transistor generated in accordance with the residual polarization.

In other words, according to the present invention, a well region is formed, and in the well region, a transistor having a ferroelectric film for storage is formed, so that a current flow to the substrate side at the time driving is performed, is prevented.

More specifically, the semiconductor substrate is maintained at a first potential, and a potential to be applied to the well region at the time of data writing or erasing is selected so that a junction between the semiconductor substrate and the well region is placed in a reverse bias condition. When the substrate is a P type, the substrate is maintained at a ground potential, and a potential of 0 V or higher is applied between the well region which serves as a channel region, and the gate electrode of the storage transistor. A voltage is applied to the ferroelectric film, and the memory is driven to induce polarization. Therefore, the junction between the substrate and the well region are always under reverse bias conditions, and no current flows to the substrate side.

According to the present invention, in order to provide a memory circuit having plural memory cells in a matrix, a write bit line to which a write voltage is applied is connected to another source or drain region of the write transistor, and a write word line is connected to the gate of the write transistor. A read bit line at which the drain current is to be detected is connected to another source or drain region of the read transistor. And a read word line is connected to the gate of the read trasistor.

A plurality of such write and read word lines are extended and arranged along rows, and a plurality of such write and read bit lines are extended along columns that intersect the rows, with the memory cells being located at the intersections.

In addition, according to the present invention, a write transistor and a read transistor having a thin-film transistor structure are formed on an insulating substrate. Separate from them, a storage transistor including a gate electrode and a semiconductor layer serving as source, drain and channel regions thereof over the gate electrode via a ferroelectric film is formed on the insulating substrate. These elements are connected in the same manner as described above to provide a memory.

Furthermore, according to the present invention, the write transistor and the read transistor are formed as an ordinal semiconductor MOS transistor in a semiconductor substrate, then the storage transistor is formed on an insulation layer on the semiconductor substrate including a gate electrode on the insulation layer, a ferroelectric film on the gate electrode, and a semiconductor layer serving as source, drain and channel regions. These elements are connected in the same manner as described above to provide a memory.

DETAILED DESCRIPTION OF THE PREFERRED EMBODIMENT

The preferred embodiment of the present invention will now be described while referring to the drawings. The technical scope of the present invention, however, is not limited to the embodiment.

Figure 1:
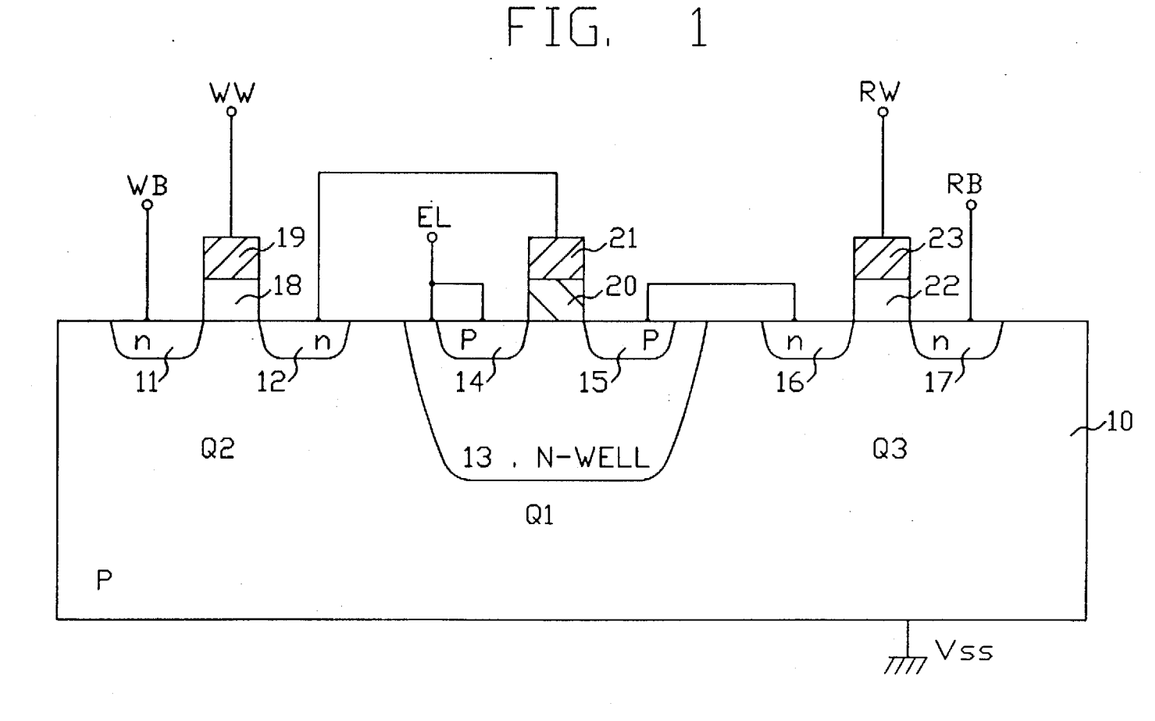
FIG. 1 is a cross sectional view of a ferroelectric memory according to one embodiment of the present invention.

FIG. 1 is a cross sectional view of a ferroelectric memory according to the embodiment of the present invention. The memory in the embodiment differs from the prior art in that an MFS transistor Q1 for storage is formed inside and on an N type well region formed at the surface of a P type semiconductor substrate 10. The N type well region 13 is connected to an erase line EL, which is maintained a high potential usually and is changed to a low potential during an erasing operation.

The storage MFS transistor is constituted by a P drain region 14, a source drain region 15, and a ferroelectric film 20 and a gate electrode 21, which are formed on a channel between the regions 14 and 15. The ferroelectric film 20 with 500 to 2000 angstroms thick is formed on a thermal oxide film (not shown) deposited on the silicon semiconductor substrate 10 by sputtering, etc. PLZT ((Pb, La) (Zr, Ti)$O_3$ or lead titanate (PbTi$O_3$)) or Yl(SrBi$_2$Ta$_2$O$_9$), for example, is employed as a ferroelectric material.

A write transistor Q2 is composed of an N type source region 11, a N type drain region 12, a gate oxide film 18, and a gate electrode 19. The N type source region 11 is connected to a write bit line WB, while the gate electrode 19 is connected to a write word line WW. The N type drain region 12 is connected to the gate electrode 21 of the MFS transistor Q1 by metal wiring, for example. To form the N type well region 13, phosphorus ($P^+$) is injected into the substrate at a concentration of $5 \times 10^{12}/cm^2$ with an energy of 180 KV by ion implantation, and the resultant structure is annealed at 1200° C. for three hours. To form the source and drain regions 14 and 15, boron ($B^+$) is injected into the substrate at a concentration of $2 \times 10^{15}/cm^2$ with an energy of 40 KV by ion implantation, and the resultant structure is annealed. The concentration of impurities in the P type substrate 10 is, for example, $10^{15}/cm^3$.

A read transistor Q3 is constituted by an N type source region 16, an N type drain region 17, a gate oxide film 22, and a gate electrode 23. The N type drain region 17 is connected to a read bit line RB, while the gate electrode 23 is connected to a read word line RW. The N type source region 16 is connected to a P region 15 of the MFS transistor Q1 by metal wiring, for example.

As is described above, the write transistor Q2 and the read transistor Q3, both of which are N channel MOS transistors, are formed on the surface of the P type semiconductor substrate 10, and the MFS transistor Q1 for storage is formed in the N type well region 13. The substrate is fixed at 0 V (Vss), and a voltage ranging from of 0 V to a power voltage Vcc (normally 5 V or 3 V) is applied to the gate electrode 21 of the MFS transistor and the N type well region 13 to perform erasing, writing and reading operations. Therefore, junction between the well region 13 and the substrate 10 are usually in a reverse bias condition, and unlike in a conventional case, there will be no current leakage and no current will flow to the substrate side. In addition, since the N type well region is separately provided, erasing and writing operations can be performed at an MFS transistor in a specific region.

Figure 2:
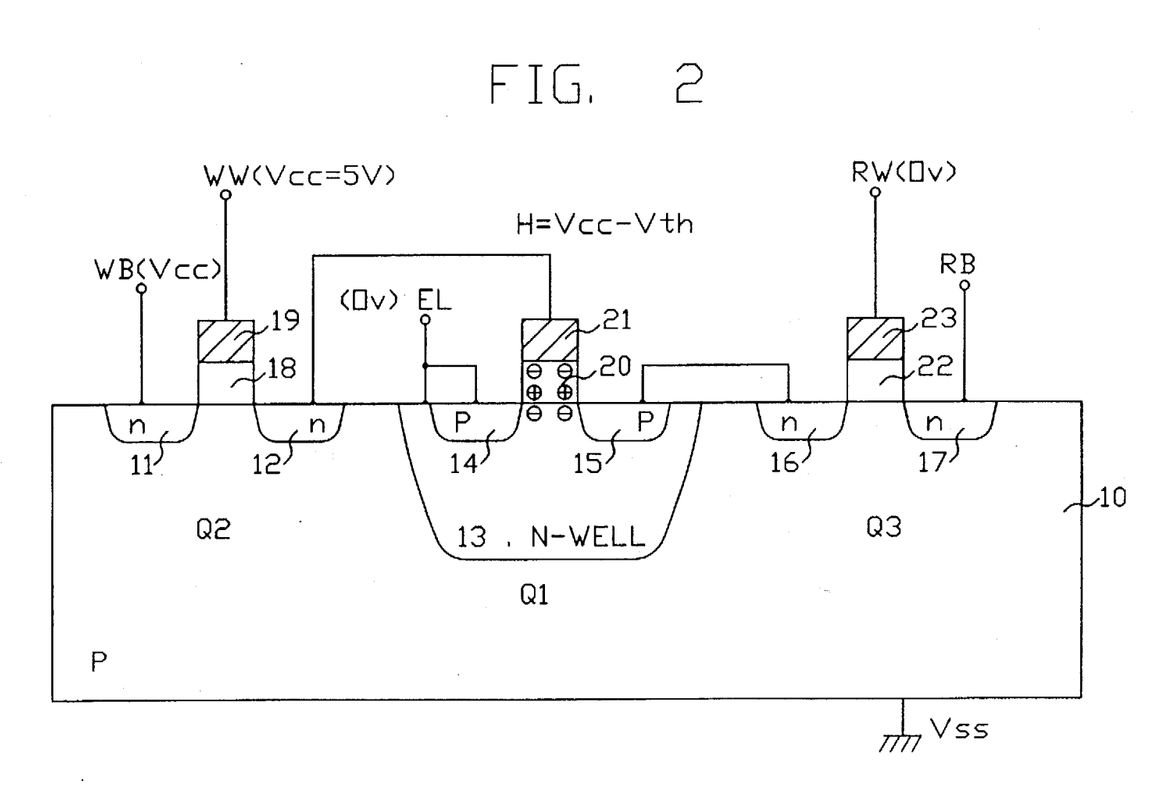
FIG. 2 is a cross sectional view for explaining an erasing operation for a memory.
Figure 3:
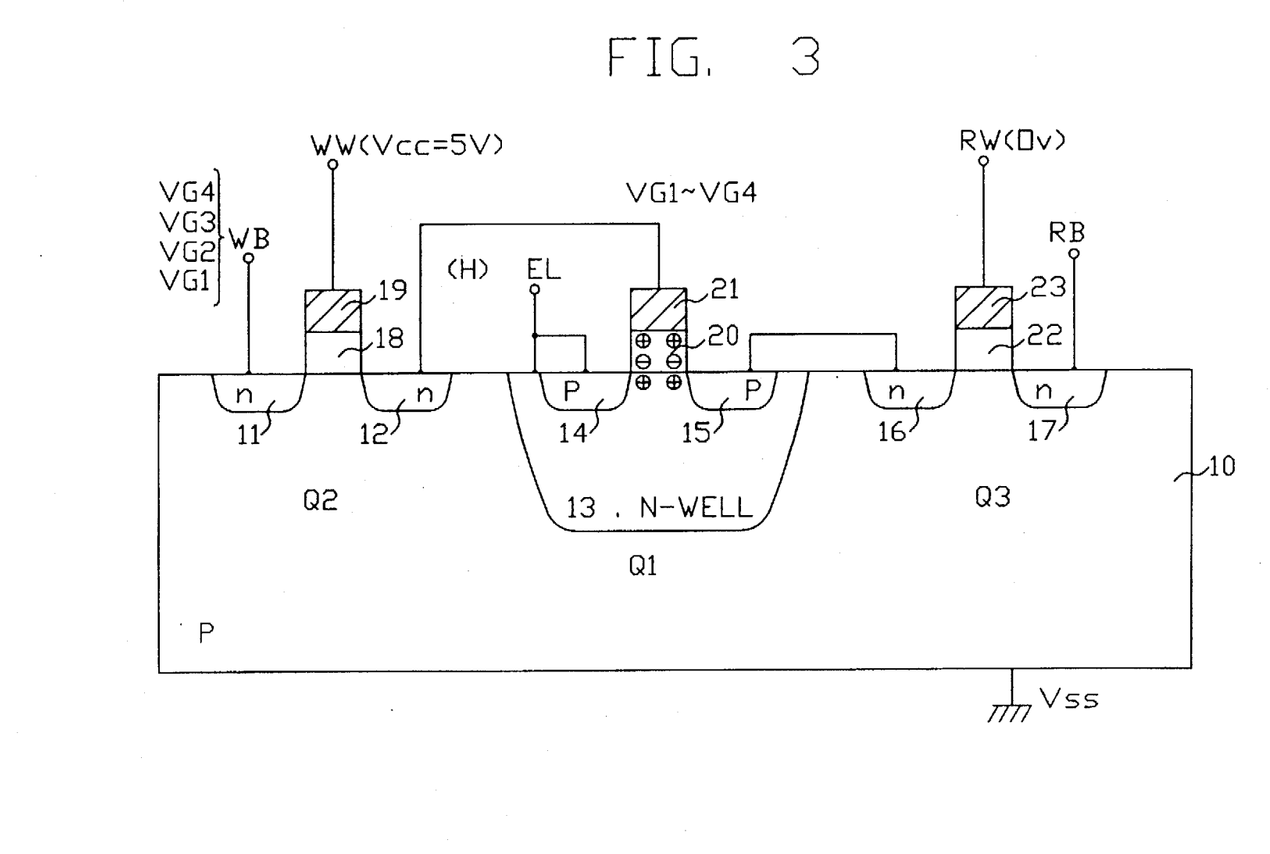
FIG. 3 is a cross sectional view for explaining a writing operation for the memory.
Figure 4:
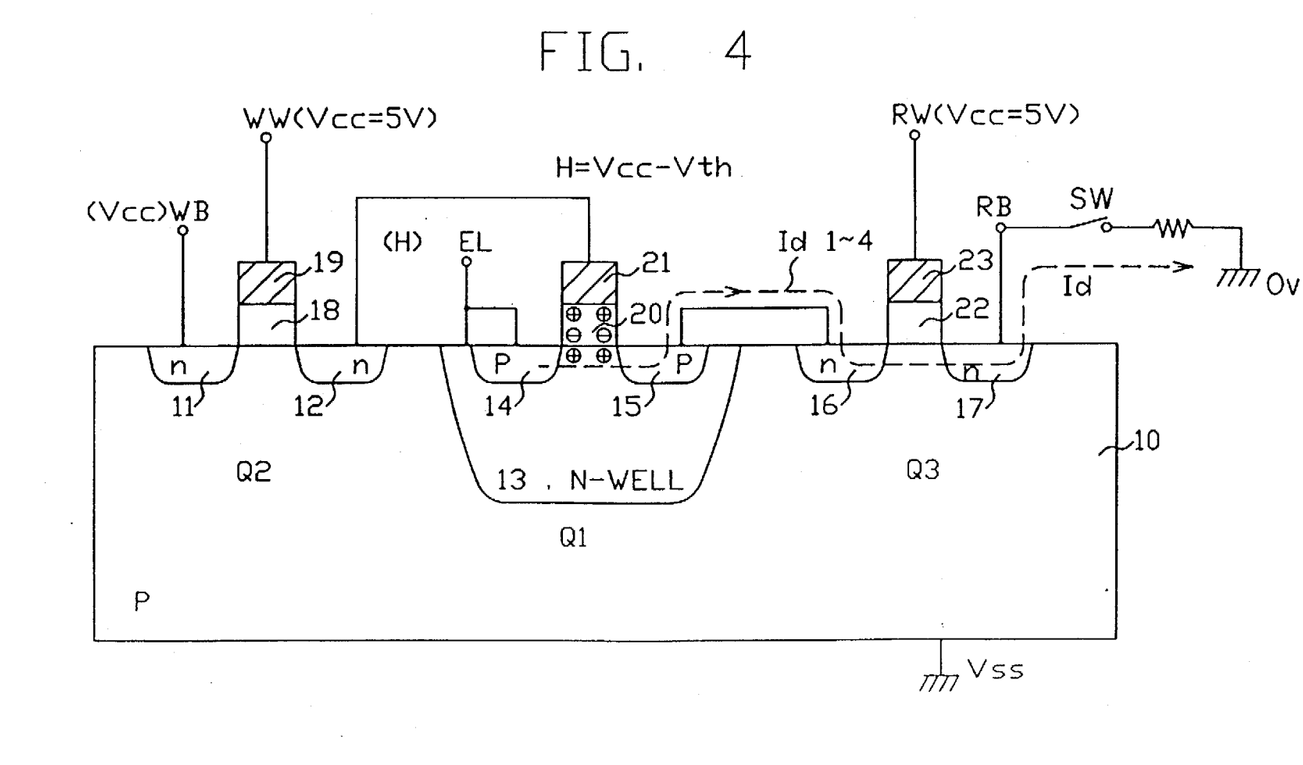
FIG. 4 is a cross sectional view for explaining a reading operation for the memory.
Figure 5:
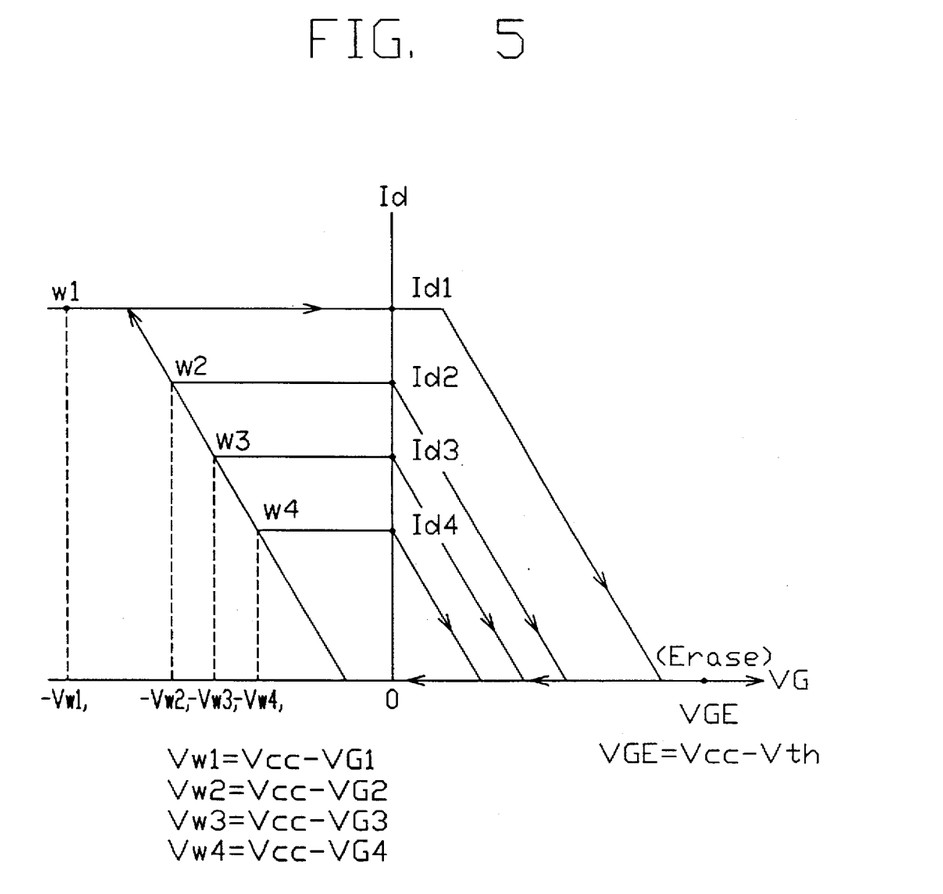
FIG. 5 is a graph showing the characteristic of a gate voltage and a drain current of an MFS transistor Q1 for explaining the residual polarization condition of a ferroelectric film.

The erasing, writing and reading operations relative to the memory cell shown in FIG. 1 will now be described. FIG. 2 is a cross sectional view for explaining the erasing operation, FIG. 3 is a cross sectional view for explaining the writing operation, and FIG. 4 is a cross sectional view for explaining the reading operation. FIG. 5 is a graph, showing the characteristics of a gate voltage and a drain current for the MFS transistor Q1, for explaining the residual polarization of the ferroelectric film 20.

Erasing Operation

For the erasing operation, the gate electrode of the MFS transistor Q1 is set at a high potential while the N type well region 13 is set at a low potential, and the write word line WW, the write bit line WB and the erase line EL are driven to apply $V_{GE}$ to the ferroelectric film 20, as is shown in FIG. 5. As a result, regardless of the previous residual polarized state, the transistor Q1 can be set to a normally-OFF state. That is the drain current Id equals zero.

More specifically, as is shown in FIG. 2, in the condition where the power voltage Vcc is maintained in the write bit line WB and 0 V is maintained in the erase line EL, the power voltage Vcc is applied to the write word line WW to render the N channel transistor Q2 conductive. As a result, a voltage (H level), which is lower than the power voltage Vcc by the equivalent of a threshold value Vth for the transistor Q2, is applied to the gate electrode 21, and the ferroelectric film 20 is polarized, as is shown in FIG. 2. Consequently, negative carriers are induced in the channel region of the transistor Q1, and the state of the P channel transistor Q1 is changed to the normally-OFF state. During the erasing operation, the read transistor Q3 is maintained in a non-conductive state by applying 0 V to the gate electrode 23 via the read word line RW.

Even when later the application of a voltage for the ferroelectric film 20 is halted, the polarized condition is maintained.

The erasing operation can be performed collectively for all of the memory cells by driving the write word lines WW, the write bit lines WB, and the erase line EL at the above voltage. Further, the erasure can be performed for a specific memory only by driving specific control lines WW, WB and EL at the above voltage. The details for such an operation will be explained later while referring to a circuit diagram.

Writing Operation

For the writing operation, the erase line EL is driven at an H level voltage (Vcc–Vth), which is lower than the power voltage Vcc by the equivalent of the threshold value Vth, to increase the potential in the N type well region 13. A voltage $V_G1$ through $V_G4$ (a voltage between 0 and Vcc) according to multi-bits data to be written is applied to a selected write bit line WB, and the power voltage Vcc (5 V) is applied to the write word line WW to render the write transistor Q2 conductive. As a result, a voltage consonant with multi-radix data, $V_w1$ through $V_w4$, is applied to the ferroelectric film 20. As is shown in FIG. 5, therefore, polarization occurs corresponding to either voltage application W1, W2, W3 or W4. Since the power voltage Vcc is applied to a non-selected word bit line WB, no voltage is applied to the ferroelectric film of a non-selected transistor Q1.

To store quaternary data, corresponding voltage $V_G1$ through $V_G4$ is applied to the gate electrode 21, and accordingly, a voltage $V_w1$ through $V_w4$, which is the difference from the power voltage Vcc applied to the N well region 13, is applied to the ferroelectric film 20.

When, for example, voltage $V_G1$ is applied to the write bit line WB, voltage $(-V_w1)$ is applied to the ferroelectric film 20, and the ferroelectric film 20 is polarized at polarities opposite to those obtained during the erasing operation, as is shown in FIG. 5. Thus, the state of the P channel transistor Q1 is changed to the normally-ON state, as is shown in FIG. 3. Further, a drain current Id1, consonant with the voltage $(-V_w1)$, is detected during a reading operation, which will be described later.

At this time, the N well region 13 and the P substrate 10 are always under reverse biased conditions, and there is no current flow toward the substrate 10.

In the above example, a voltage corresponding to multi-bits data has been applied via the write bit line WB. To store binary data, for example, the voltage $V_G1$, or 0 V, is applied to the write bit line WB to select the state of the transistor Q1, which is either changed to the normally-OFF state or is maintained in the normally-OFF state.

Reading Operation

For the reading operation, the write transistor Q2 is rendered conductive, and a voltage at an H level (H=Vcc–Vth), which is lower than the power voltage Vcc, applied from the write bit line WB, by the equivalent of the threshold value Vth, is applied to the gate electrode 21. The voltage at the same H level (H=Vcc–Vth) is applied to the N type well region 13 from the erase line EL to set the ferroelectric film 20 to the condition where no voltage is applied. The voltage along the horizontal axis in FIG. 5 represents the 0 V condition. When the read transistor Q3 is rendered conductive, the magnitude of the drain current Id of the MFS transistor Q1 is detected by a reading circuit R, which is connected to the read bit line RB via a switch SW. The magnitude of the current Id1 to Id4 is detected in consonance with the residual polarization of the ferroelectric film 20, and the stored multi-bits data are read.

Memory Circuit

Figure 6:
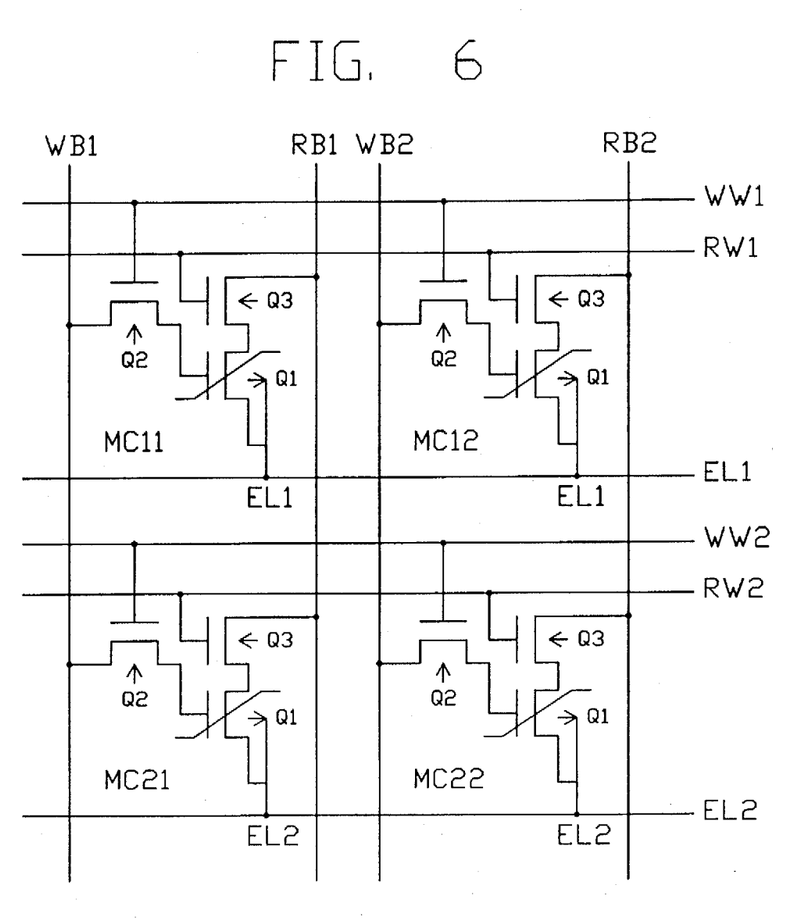
FIG. 6 is a circuit diagram for a three transistor memory shown in FIG. 1.

FIG. 6 is a circuit diagram for the three-transistor memory shown in FIG. 1. For an example shown in FIG. 6, four memory cells MC 11 through MC 22 are arranged to form 2 rows and 2 columns, in matrix. WW1 and WW2 denote write word lines extending in the direction of the rows; RW1 and RW2, read word lines extending in the direction of the rows; WB1 and WB2, write bit lines extending along the columns; RB1 and RB2, read bit lines extending along the columns; and EL1 and EL2, erase lines extending along the rows. As is shown in FIG. 6, each of the memory cells MC 11 through MC 22 has three interconnected transistors Q1, Q2 and Q3.

Figure 7:
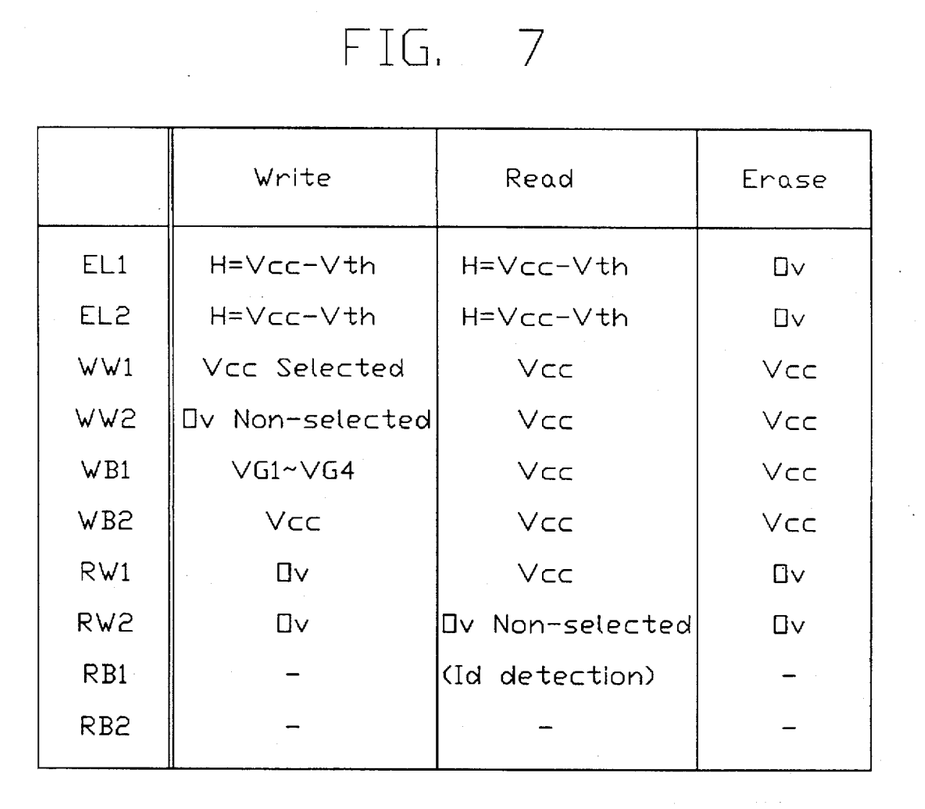
FIG. 7 is a table showing a relationship of drive potentials for control lines when all data in the memory are to be erased, and data are to be written in and read from a memory cell MC.

An explanation will be given for how the erasing, writing and reading operations are performed for the matrix shaped memory circuit in FIG. 6. FIG. 7 is a table showing the relationships for individual control lines when the entire memory is erased, and data are written to and read from the memory cell MC 11.

When data in all the memory cells are erased during the operation, a voltage shown in FIG. 2 is applied to all of the control lines, as is indicated in the erase column in FIG. 7.

To write multi-bits data in the memory cell MC 11, the erase lines EL 1 and EL2 are set to H level (Vcc–Vth), and the read word lines RW1 and RW2 are set to 0 V. The power voltage Vcc is applied to the selected write word line WW1, and 0 V is applied to the non-selected write word line WW2. The voltages $V_G1$ through $V_G4$, corresponding to data to be stored, are applied to the write bit line WB1. Then, the data are written in the memory cell MC 11 as explained above. The power voltage Vcc is applied to the non-selected word bit line WB2.

Finally, during the reading operation, the H level voltage (H=Vcc–Vth) is applied to the erase lines EL1 and EL2, and the power voltage Vcc is applied to the write word lines WW1 and WW2 and the write bit lines WB1 and WB2. Then, the power voltage vcc is applied to the selected read word line RW1 to render the read transistor Q3 conductive, and 0 V is applied to the non-selected read word line RW2 to render the transistor Q2 non-conductive. The selected read bit line RB1 is connected to a current detection circuit (not shown), which detects the magnitude of the drain current Id from the memory cell MC 11.

Since the erase lines EL1 and EL2 are driven at the same voltage in the above described operation, they can be lines that are used in common. However, as is shown in FIG. 6, the erase lines EL1 and EL2 can be separately extended in the direction of the rows to perform an erasing operation for a specific, individual memory cell lying along a row. In this case, the N type well region can be so provided that it extends in the direction of a row.

Figure 8:
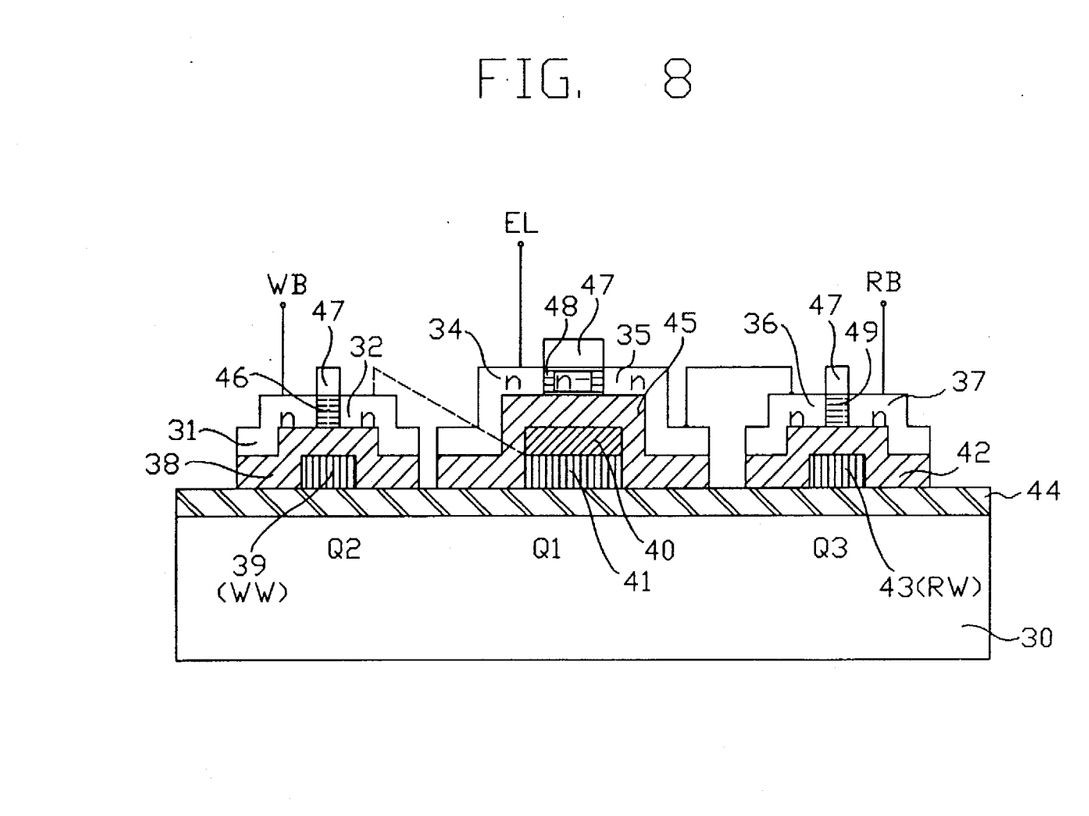
FIG. 8 is a cross sectional view of the memory cell wherein three transistors Q1, Q2 and Q3 are formed of a thin-film transistor TFT structure using polysilicon on an insulating substrate.
Figure 9:
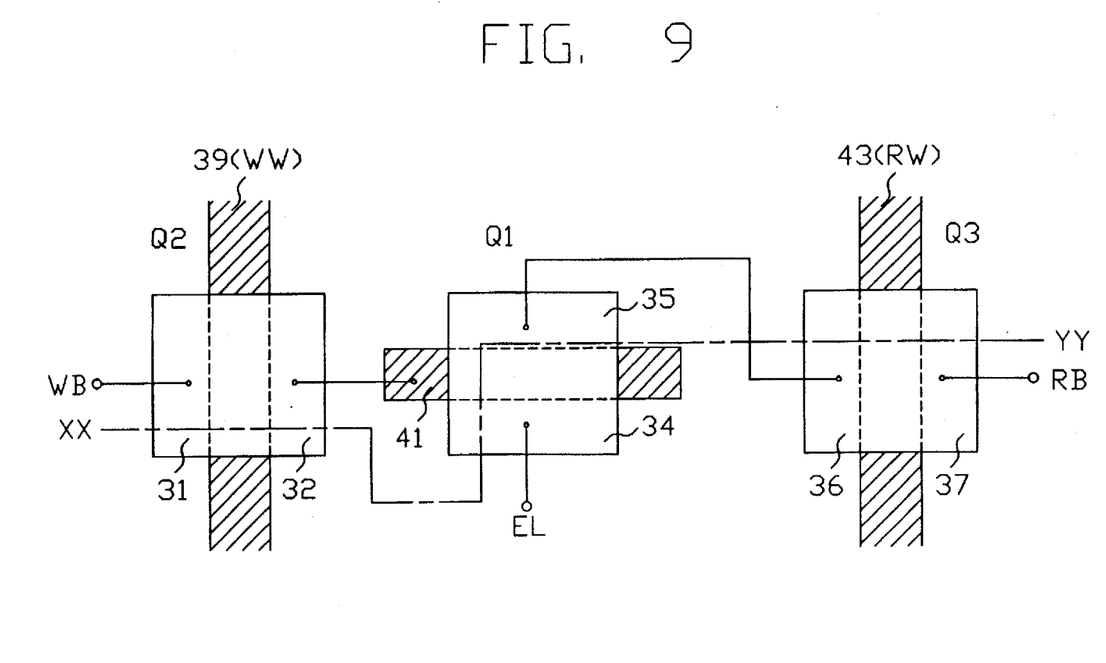
FIG. 9 is a schematic plan view of the structure in FIG. 8.

FIG. 8 is a cross sectional view of a memory cell in which three transistors Q1, Q2 and Q3, of a thin-film transistor (TFT), are formed using polysilicon on an insulating substrate 30 made of quartz, for example. FIG. 9 is a schematic plan view of the memory cell. A cross section taken along chain line XX–YY in the plan view in FIG. 9 corresponds to FIG. 8.

Each of the transistors Q1, Q2 and Q3 has a thin-film transistor structure for which a silicon oxide film 44 is formed on the surface of an insulating substrate 30 of quartz, etc., with metal gate electrodes 39, 41 and 43, insulation films, such as silicon oxide films, 38, 45 and 42, N type source regions and drain regions 31, 32, 34, 35, 36 and 37, and N⁻ channel regions 46, 48 and 49 being formed in layers thereon; and with protective films 47 being formed on the channel regions. A ferroelectric film 40 is formed on the gate electrode 41 of the transistor Q2 for data storage.

The N type source and drain regions, and the N⁻ channel regions are formed by laser annealing of amorphous silicon to prepare polysilicon layers. This process is the same as that which is used for forming a common thin-film transistor.

With the above configuration, since the source and drain regions of the transistors are formed separately, there is no problem of current leakage. Further, since the areas of the PN junctions in the individual regions are greatly reduced, the switching speed can be increased. In addition, a memory can be fabricated at a lower cost than can one that uses a semiconductor substrate. The operation in the memory is the same as that in the above embodiment, except that the polarity of the MFS transistor is the N channel. No explanation for it will be given.

Figure 10:
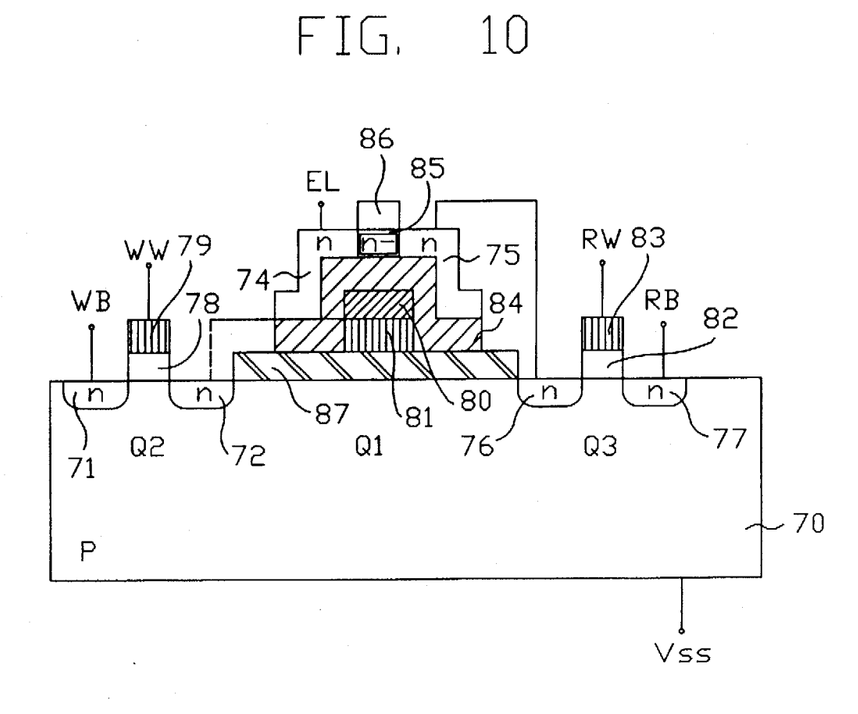
FIG. 10 is a cross sectional view of a memory cell wherein an MFS transistor Q2 of a thin-film transistor structure is formed on a semiconductor substrate.

FIG. 10 is a cross sectional view of a memory cell wherein an MFS transistor Q2 having a thin-film transistor structure is formed on a semiconductor substrate 70. This example is the same as the memory cell in FIG. 1, in that an N channel write transistor Q2 and an N channel read transistor Q3 are formed on the P type semiconductor substrate 70. One difference from FIG. 1 is that an MFS transistor Q1 having a TFT structure is formed not in the N type well region but on a silicon oxide film 87.

That is, on the silicon oxide film 87 is formed the MFS transistor Q1, which is constructed of a metal gate electrode 81; a ferroelectric film 80; a silicon oxide film 84; polysilicon layers 74, 75 and 85, which are obtained by the laser annealing of amorphous silicon, or by the thermal annealing of amorphous silicon at approximately 450° C.; and a protective film 86. The ferroelectric film 80 is provided by forming a film by sputtering, for example, and annealing it.

With this configuration, current does not leak to the substrate. Since the memory operation is performed in the same manner, as was previously described, no explanation for it will be given.

As is described above, according to the present invention, a memory cell structure employing a ferroelectric film to perform a normal memory operation can be provided. In addition, a memory cell structure can be provided with which multi-bits data can be stored by polarizing the ferroelectric film.

What we claim are:

1. A ferroelectric memory using residual polarization of a ferroelectric film comprising:

a semiconductor substrate of one conductive type;

a write transistor having a source region and a drain region of another conductive type formed at a surface of the semiconductor substrate;

a read transistor having a source region and a drain region of another conductive type formed at the surface of the semiconductor substrate; and a storage transistor having a source region and a drain region of one conductive type formed at a well region of another conductive type at the surface of the semiconductor substrate, wherein one source of drain region of the write transistor is connected to a gate electrode of the storage transistor, and one source or drain region of the storage transistor is connected to one source or drain region of the read transistor so as to provide a memory cell, write or erase operation is performed by inducing polarization in the ferroelectric film through applying a predetermined voltage between the well region and the gate electrode of the storage transistor, and read operation is performed by detecting a drain current for the storage transistor through the read transistor generated in accordance with the residual polarization, and wherein the semiconductor substrate is maintained at a first potential, and a potential to be applied to the well region at the time of data writing or erasing is selected so that junction between the semiconductor substrate and the well region is placed in a reverse bias condition.

2. A ferroelectric memory according to claim 1, further comprising:

a write bit line to which a write voltage is applied, connected to another source or drain region of the write transistor;

a write word line connected to the gate of the write transistor;

a read bit line at which the drain current is to be detected, connected to another source or drain region of the read transistor; and a read word line connected to the gate of the read transistor.

3. A ferroelectric memory according to claim 1, wherein: a plurality of said write and read word lines are extended along rows, and a plurality of said write and read bit lines are extended along columns which intersect the rows, with the memory cells being located at the intersections thereof.

4. A ferroelectric memory according to the claim 2 or 3, further comprising:

a well region control line connected to the well region for supplying a potential for write or erase thereto.

5. A ferroelectric memory using residual polarization of a ferroelectric film comprising:

a semiconductor substrate of one conductive type;

a write transistor having a source region and a drain region of another conductive type formed at a surface of the semiconductor substrate;

a read transistor having a source region and a drain region of another conductive type formed at the surface of the semiconductor substrate; and a storage transistor having a source region and a drain region of one conductive type formed at a well region of another conductive type at the surface of the semiconductor substrate;

wherein one source or drain region of the write transistor is connected to a gate electrode of the storage transistor, and one source or drain region of the storage transistor is connected to one source or drain region of the read transistor so as to provide a memory cell, write or erase operation is performed by inducing polarization in the ferroelectric film through applying a predetermined voltage between the well region and the gate electrode of the storage transistor, and read operation is performed by detecting a drain current for the storage transistor through the read transistor generated in accordance with the residual polarization, wherein said semiconductor substrate includes P-type impurities and is connected to a ground level, and a potential higher than the ground level is applied to the well region and the drain or source region of the storage transistor.

6. A ferroelectric memory using a residual polarization of a ferroelectric film comprises:

an insulative substrate;

a write transistor having a gate electrode formed on the insulative substrate, gate insulation layer formed on the gate electrode, and a semiconductor layer formed thereover including source, drain and channel regions;

a read transistor having a gate electrode formed on the insulative substrate, gate insulation layer formed on the gate electrode, and a semiconductor layer formed thereover including source, drain snd channel regions; and a storage transistor having a gate electrode formed on the insulative substrate, said ferroelectric film formed over the gate electrode, and a semiconductor layer formed thereover including source, drain snd channel regions;

wherein one source or drain region of the write transistor is connected to the gate electrode of the storage transistor, and one source or drain region of the storage transistor is connected to one source or drain region of the read transistor so as to provide a memory cell, write or erase operation is performed by applying a predetermined voltage between the channel region and the gate electrode of the storage transistor so as to induce a polarization to the ferroelectric film, and read operation is performed by detecting a drain current of the storage transistor through the read transistor generated in accordance with the residual polarization.

7. A ferroelectric memory using a residual polarization of a ferroelectric film comprises:

a semiconductor substrate of one conductivity type;

a write transistor having a source region and a drain region of another conductive type formed at a surface of the semiconductor substrate;

a read transistor having a source region and a drain region of another conductive type formed at the surface of the semiconductor substrate; and a storage transistor having a gate electrode, the ferroelectric film formed on the gate electrode, a semiconductor layer formed over the ferroelectric film having source, drain and channel region formed therein, said storage transistor being formed on an insulation layer formed on the semiconductor substrate;

wherein one source or drain region of the write transistor is connected to the gate electrode of the transistor, and one source or drain region of the transistor is connected to one source or drain region of the read transistor so as to provide memory cell, a write or erase operation is performed by applying a predetermined voltage between the channel region and the gate electrode of the storage transistor so as to induce a polarization to the ferroelectric film, and read operation is performed by detecting a drain current of the storage transistor through the read transistor generated in accordance with the residual polarization.

8. A ferroelectric memory using residual polarization of a ferroelectric film comprising:

a semiconductor substrate of one conductive type;

a write transistor having a source region and a drain region of another conductive type formed at a surface of the semiconductor substrate;

a read transistor having a source region and a drain region of another conductive type formed at the surface of the semiconductor substrate; and a storage transistor having a source region and a drain region of one conductive type formed at a well region of another conductive type at the surface of the semiconductor substrate;

wherein one source or drain region of the write transistor is connected to a gate electrode of the storage transistor, and one source or drain region of the storage transistor is connected to one source or drain region of the read transistor so as to provide a memory cell, write or erase operation is performed by inducing polarization in the ferroelectric film through applying a predetermined voltage between the well region and the gate electrode of the storage transistor, and read operation is performed by detecting a drain current for the storage transistor through the read transistor generated in accordance with the residual polarization;

a write bit line to which a write voltage is applied, connected to another source or drain region of the write transistor;

a write word line connected to the gate of the write transistor;

a read bit line at which the drain current is to be detected, connected to another source or drain region of the read transistor;

a read word line connected to the gate of the read transistor; and a well region control line connected to the well region for supplying a potential for write or erase thereto.

9. A ferroelectric memory using residual polarization of a ferroelectric film comprising:

a semiconductor substrate of one conductive type;

a write transistor having a source region and a drain region of another conductive type formed at a surface of the semiconductor substrate;

a read transistor having a source region and a drain region of another conductive type formed at the surface of the semiconductor substrate;

a storage transistor having a source region and a drain region of one conductive type formed at a well region of another conductive type at the surface of the semiconductor substrate; and a well region control line connected to the well region for supplying a potential for write or erase thereto, wherein one source or drain region of the write transistor is connected to a gate electrode of the storage transistor, and one source or drain region of the storage transistor is connected to one source or drain region of the read transistor so as to provide a memory cell, write or erase operation is performed by inducing polarization in the ferroelectric film through applying a predetermined voltage between the well region and the gate electrode of the storage transistor, and read operation is performed by detecting a drain current for the storage transistor through the read transistor generated in accordance with the residual polarization, and wherein a plurality of said write and read word lines are extended along rows, and a plurality of said write and read bit lines are extended along columns which intersect the rows, with the memory cells being located at the intersections thereof.

* * * * *